(12) United States Patent
Parulkar et al.

(10) Patent No.: US 6,363,509 B1
(45) Date of Patent: Mar. 26, 2002

(54) METHOD AND APPARATUS FOR TRANSFORMING SYSTEM SIMULATION TESTS TO TEST PATTERNS FOR IC TESTERS

(75) Inventors: Ishwar Parulkar, Los Angeles; Kamalesh N. Ruparel, San Jose, both of CA (US)

(73) Assignee: Apple Computer, Inc., Cupertino, CA (US)

( * ) Notice: Subject to any disclaimer, the term of this patent is extended or adjusted under 35 U.S.C. 154(b) by 985 days.

(21) Appl. No.: 08/590,695

(22) Filed: Jan. 16, 1996

(51) Int. Cl.[7] ............................................... G01R 31/28
(52) U.S. Cl. ...................... 714/738; 714/742
(58) Field of Search .................. 371/27, 22.1; 364/489, 364/488, 578, 580; 324/73.1; 714/724, 738, 741, 742, 33, 26

(56) References Cited

U.S. PATENT DOCUMENTS

| | | | |
|---|---|---|---|
| 5,282,146 A | * | 1/1994 | Aihara et al. ................ 364/489 |
| 5,390,193 A | * | 2/1995 | Millman et al. ............... 371/27 |
| 5,390,194 A | * | 2/1995 | Mannle ........................ 371/27 |
| 5,400,270 A | * | 3/1995 | Fukui et al. ................. 364/578 |
| 5,475,624 A | * | 12/1995 | West ........................... 364/578 |
| 5,546,408 A | * | 8/1996 | Keller .......................... 371/27 |

OTHER PUBLICATIONS

Parker, Kenneth P., "Integrating Design and Test: Using CAE Tools for ATE Programming" Computer Society Press of the IEEE, 1987, Washington D.C.

* cited by examiner

Primary Examiner—Nadeem Iqbal
(74) Attorney, Agent, or Firm—Beyer Weaver & Thomas, LLP

(57) ABSTRACT

Techniques are disclosed for functionally testing integrated circuit chips for the particular design for which they are intended. The techniques operate to automatically and intelligently transform a test designed for verifying the design of a simulation model of an electronic system to test patterns for an isolated test on an Automatic Testing Equipment (ATE) system, of a particular integrated circuit chip within the simulation model.

29 Claims, 6 Drawing Sheets

METHOD AND APPARATUS FOR TRANSFORMING SYSTEM SIMULATION TESTS TO TEST PATTERNS FOR IC TESTERS

BACKGROUND OF THE INVENTION

1. Field of the Invention

The present invention relates to integrated circuit testing and, more particularly, to functional testing of integrated circuit chips.

2. Description of the Related Art

The design of electrical circuits usually begins with computers modeling the functioning that electronic circuitry to be designed is to implement. The functional model is then typically simulated on a computer using a simulation program. Typically, the modeling programs and the simulation programs together form a Computer Aided Design (CAD) environment used by designers of electronic circuitry. Verilog Hardware Descriptive Language (Verilog HDL) is an example of a design description language that supports simulation at various levels of chip design.

The electronic circuitry is usually designed for an electronic circuit board (i.e., printed circuit board) and such boards frequently include numerous integrated circuit chips, wires or metal traces, passive devices, and active devices. FIG. 1 illustrates a simplified electronic circuit board 100 including various integrated circuit chips and other devices and components. In particular, the electronic circuit board 100 includes integrated circuit chip A 102, integrated circuit chip B 104, integrated circuit chip C 106, and miscellaneous other devices or components 108. The simplified electronic circuit board 100 also illustrates various wires or metal traces interconnecting the various chips, devices and components.

By using the modeling and simulation software packages, today's electronic circuit designer is able to model the circuit board 100 without using hardware and to simulate the operation of the circuit board 100 again without using hardware. Hence, the simulation programs enable the designer to verify the functionality of the model that has been designed by simulating its operations in accordance with the model. Such simulations are carried out using functional tests which are deterministic stimuli designed to produce a desired response in the design. The simulated response of the design can then be compared to an expected response to determine whether or not the model of the circuit board 100 is functioning correctly. If the model of the circuit board 100 is not functioning correctly, the model is modified. Thereafter, the circuit board 100 is again simulated. The process is repeated until the model of the circuit board 100 functions correctly. In verifying the functionality of the model of the circuit board 100, numerous functional tests are performed and their responses obtained.

Once the design has been verified by the board level simulation, the individual devices associated with the circuit board 100 are manufactured. It is not uncommon for the manufacturer of the isolated devices to be different vendors. Such vendors are required to test the devices they produce for use in the circuit board 100. As an example, the devices include integrated circuit chips such as Application Specific Integrated Circuits (ASICs). Normally, vendors of integrated circuit chips perform structural tests so as to primarily verify their fabrication process (e.g., test for defects). In addition, the designer of the circuit board 100 would also prefer that the integrated circuit chip vendors perform functional testing on the integrated circuit chips. Specifically, the designer of the circuit board 100 would like the integrated circuit chip vendor to verify that the integrated circuit chips they produce function in the manner in which they have been modeled. This is a difficult task and one which is placed upon production test. The production test engineer is required to handcraft various tests to attempt to test the functionality of the integrated circuit chips. The difficulty is that the production test engineer is unable to fully test the complete functionality of the integrated circuit chips using handcrafted tests. The functioning of the integrated circuits is simply too complex for a human to handcraft a sufficient number of tests in a reasonable amount of time so that the integrated circuit chip can be functionally verified for the design for which it is intended.

Designers are responsible for creating the designs of chips and verifying that all important design criteria have been met. The production test engineers are responsible for ensuring high quality and reliability of the chips. Often, a production test engineer ends up trying to make design verification tests (designed by the designer) succeed on automatic testing equipment (ATE) systems. However, the differences between the simulation world of the designer (which is software modeling) and the physical world of the production test engineer (ATE systems) make it difficult to translate simulation tests to ATE tests in a straightforward manner. The designer uses a software model which is an approximation of a real circuit. Judgment is used to filter responses for aberrations that are attributes of the modeling process rather than true characteristics of the circuit. As a result, the process of design verification is a highly creative, judgment-driven, human and imperfect process. The production test engineer tests the physical realization of the circuit (chip) on an ATE system. The ATE system performs physical experiments on the chip and physical laws and constraints are involved with such real world testing. These physical laws and constraints dictate limits that may not have been observed during design verification. As a result of these differences, it becomes very difficult to directly translate simulation data (from the design verification) to tester data (for an ATE system). What happens often is that the design verification test is shortened, relaxed, and then augmented to address considerations that are important to ATE systems. The process of transforming a verification test to a useful production test is generally difficult for someone not familiar with both the design and the ATE system. Hence, there is a need for an automatic way of efficiently and accurately transforming simulation data from the software world to tester data in the physical world with minimal involvement of the designer.

SUMMARY OF THE INVENTION

Broadly speaking, the invention relates to techniques for functionally testing integrated circuit chips for the particular design for which they are intended. The invention intelligently transforms a test designed for verifying the design of a simulation model of an electronic system to data for an isolated test of a particular integrated circuit within the simulation model on an integrated circuit (IC) tester.

The invention can be implemented in numerous ways, including as a method, an apparatus, or a system, or on a computer readable medium.

A first implementation of the invention pertains to a computer-implemented method for functionally testing an integrated circuit chip using test patterns derived from simulation tests performed on a system model which includes the integrated circuit chip. The method includes the following operations: receiving a simulation model for an electronic system and a simulation test for the simulation model; identifying a portion of the simulation model to be individually tested; producing portion-specific simulation test data based on at least the portion identified and the simulation test; and deriving test patterns and timing information for testing the portion identified using the portion-specific simulation test data. Preferably, the portion identified is an integrated circuit chip, and the derived test patterns and timing information are IC tester data used on an automatic testing equipment (ATE) type chip tester. Additionally, the method may also determine, using the simulation model, internal control signals for bidirectional pins or tristate output pins within the portion of the simulation model, and include one or more dead cycles within the derived test patterns so that the bidirectional pins can be properly tested.

A second implementation of the invention pertains to an automated method for producing test patterns for testing an IC chip on an IC tester. The test patterns are derived from a system model and a simulation test for the system model. The method includes the following operations: receiving the system model; determining the signals within the system model that correspond to pins of the IC chip; determining internal control signals for the pins of the IC chip that are bidirectional or tristate outputs; using a simulation tool, the system model and the signals determined by the previous operations, produce a time event list for the IC chip, the time event list includes signal values and relative times for signal changes; scanning the time event list to determine a tester cycle for the IC tester and a number of frames for the tester cycle; and deriving test patterns and timing information for testing the IC chip on the IC tester in accordance with the time event list.

A third implementation of the invention pertains to a computer-implemented method for functionally testing an integrated circuit chip using test patterns derived from simulation tests performed on a system model which includes the integrated circuit chip. The method includes the following operations: receiving simulation test information for testing the system model; extracting signals pertaining to the integrated circuit chip from the simulation test information; and deriving test patterns and timing information for testing the integrated circuit chip based on the extracted signals. The method may then test the functionality of the integrated circuit chip on an IC tester using the derived test patterns and the timing information. The invention may also determine, using the simulation test information, internal control signals for bidirectional pins within the portion of the electronic system, and the deriving operates to include one or more dead cycles within the derived test patterns so that certain of the bidirectional pins can be properly simulation.

A fourth implementation of the invention pertains to an apparatus for functionally testing an integrated circuit chip using test patterns derived from simulation tests performed on a system model which includes the integrated circuit chip. The apparatus includes at least the following: means for receiving a simulation model for an electronic system and a simulation test for the simulation model; means for identifying a portion of the simulation model to be individually tested; means for producing portion-specific simulation test data based on at least the portion identified and the simulation test; and means for deriving test patterns for testing the portion identified using the portion-specific simulation test data.

A fifth implementation of the invention pertains to an automated simulation-to-test pattern conversion system for use in testing an integrated circuit chip. The apparatus includes at least a signal extractor for receiving data associated with an electronic system simulation model, and for identifying signals within the electronic system simulation model that are relevant to testing the integrated circuit chip and for identifying control signals for bidirectional pins or tristate output pins within the electronic system simulation model; a test information producing unit for producing chip-specific test information for the integrated circuit chip to be tested in accordance with the electronic system simulation model, the identified signals, and a simulation test for the electronic system simulation model; and a test pattern processor for receiving the chip-specific test information and the identified control signals and for producing test patterns for testing the integrated circuit chip functionally as it was tested on a system level. Preferably, the test patterns produced by the test pattern processor are for an IC tester, and the test pattern processor (i) determines a number of frames for a tester cycle for the IC tester, (ii) determines from the chip-specific test information and the identified control signals, the bidirectional pins of the integrated circuit chip that require dead cycles, (iii) provides a dead cycle within the test patterns for the bidirectional pins of the integrated circuit chip that are determined to change direction in the same tester cycle of the chip-specific test information; and (iv) determines timing or sequencing information for driving or strobing pins of the integrated circuit chip during the tester cycle.

A sixth implementation of the invention pertains to a computer readable medium containing program instructions for functionally testing an integrated circuit chip using test patterns derived from simulation tests performed on a system model which includes the integrated circuit chip. The computer readable medium includes computer readable code devices for receiving a simulation model for an electronic system and a simulation test for the simulation model; computer readable code devices for identifying a portion of the simulation model to be individually tested; computer readable code devices for producing portion-specific simulation test data based on at least the portion identified and the simulation test; and computer readable code devices for deriving test patterns and timing information for testing the portion identified using the portion-specific simulation test data.

The invention provides advantages over previous techniques for functionally testing integrated circuit chips. One advantage of the invention is that the integrated circuit chips can be tested more thoroughly and cost effectively. In particular, design verification tests created during chip design can be automatically converted for testing fabricated chips on an IC tester. Fault coverage is not sacrificed and the test patterns can be automatically produced for an ATE tester in accordance with the specifications of the ATE tester. Hence, the designer need not be concerned with ATE considerations or ATE specifications when designing design verification tests. Another advantage of the invention is that the testing of the integrated circuit chip is customized for the design for which the chip is intended. Another advantage of the invention is that accurate fault simulation and fault grading of the patterns are facilitated.

Other aspects and advantages of the invention will become apparent from the following detailed description, taken in conjunction with the accompanying drawings, illustrating by way of example the principals of the invention.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION OF THE INVENTION

Figure 1:
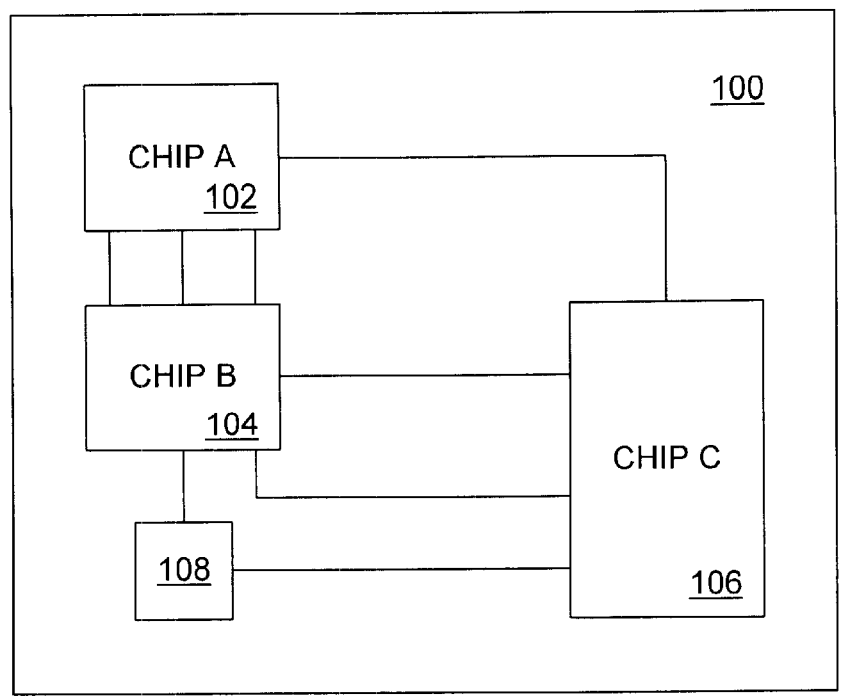
FIG. 1 illustrates a simplified electronic circuit board including various integrated circuit chips and other devices and components.

Embodiments of the invention are discussed below with reference to FIGS. 2–6. However, those skilled in the art will readily appreciate that the detailed description given herein with respect to these figures is for explanatory purposes as the invention extends beyond these limited embodiments.

Circuit designers today use CAD systems to simulate and test their circuit designs. Production test engineers, on the other hand, test integrated circuits chips which have been fabricated. Because design engineers and production test engineers tend to be different groups which cooperate only minimally, production test engineers are typically (at least initially) not very familiar with the design or the functioning of the integrated circuit chips to be tested. Design engineers are also usually unfamiliar with constraints of automated testing equipment (ATE) which tend to vary with vendor. As a result, it is difficult for production engineers to thoroughly test the integrated circuit chips.

The testing of individual integrated circuit chips is usually performed by ATE. The manufacturer of the integrated circuit chips uses the ATE to test the integrated circuits chips produced prior to supplying the integrated circuit chips to the customer whom has ordered the chips.

CAD systems test designs (i.e., software models) against design criteria. ATE systems, on the other hand, test physical devices using real volts, amperes and nanoseconds which are limited by the laws of physics. Such limitations are not likely observed during simulation by the CAD system. ATE systems also use special types of signals such as RZ (return-to-zero), NRZ (non-return-to-zero) and SR0 (suppressible return-to-zero) to specify characteristics of the signals to be supplied by the ATE tester during testing. The lack of cooperation between designer and production test engineers, together with these fundamental differences between design and production testing environments, make production testing even more difficult.

A description of a basic test performed by an ATE tester is as follows. In every tester cycle, the ATE induces drive events on certain pins (input pins and bidirectional pins acting as inputs at that time) that cause the integrated circuit under test to react. At some point in the tester cycle, a resultant state is reached. Then, comparators are used to strobe certain pins (output pins and bidirectional pins acting as outputs at the time) and compare the strobed values to expected responses of the integrated circuit under those conditions.

A test pattern (test vector) for the ATE tester specifies a set of parallel events performed by drivers and comparators of the ATE tester. A sequencer of an ATE tester causes the drivers and comparators to "execute" a series of test patterns. The sequence also governs the period for such tester cycle. A test is then a collection of properly sequenced test patterns. The execution of the test patterns will exercise the IC being tested and any malfunctions within the IC will show up by one or more comparators of the ATE tester giving an error signal during one or more test patterns.

Figure 2:
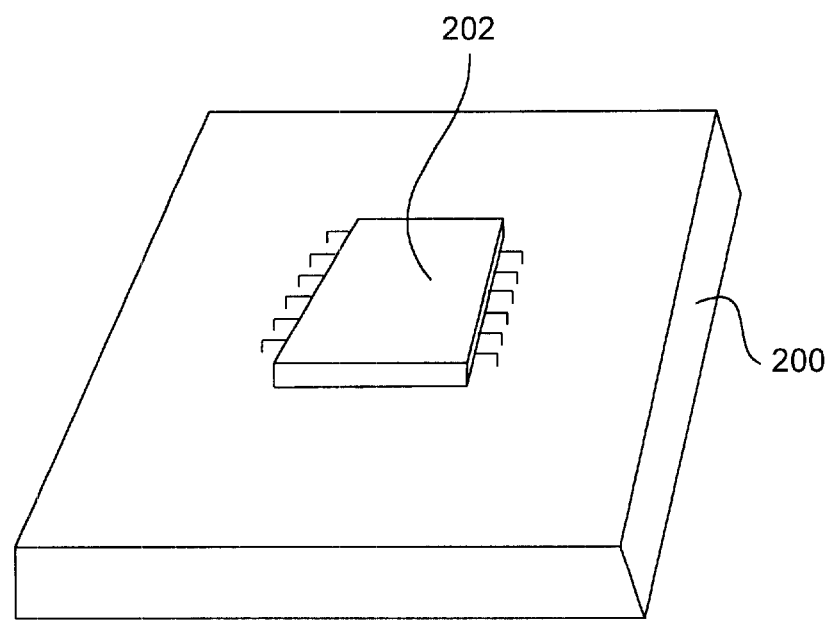
FIG. 2 illustrates a perspective view of an automated testing equipment (ATE) tester having an integrated circuit mounted thereon for testing.

FIG. 2 illustrates a perspective view of an ATE tester 200 having an integrated circuit 202 mounted thereon for testing. The ATE tester 200 receives test vectors or test patterns from an external source and applies and reads various signals to the pins or pads of the integrated circuit 202 to test the integrated circuit chip 202. As for functional testing of the integrated circuit chip 202, the test vectors for testing the functionality of the associated therewith must be handcrafted. As discussed above, the handcrafting of such tests is a tedious, time consuming and problematic task.

The invention overcomes the problems associated with the handcrafting of such tests by automating the generation of the functional tests through a conversion technique in which tests used to simulate the system (e.g., circuit board) model are transformed or converted into data (test patterns, signal types and sequencing information) for an ATE tester.

Figure 3:
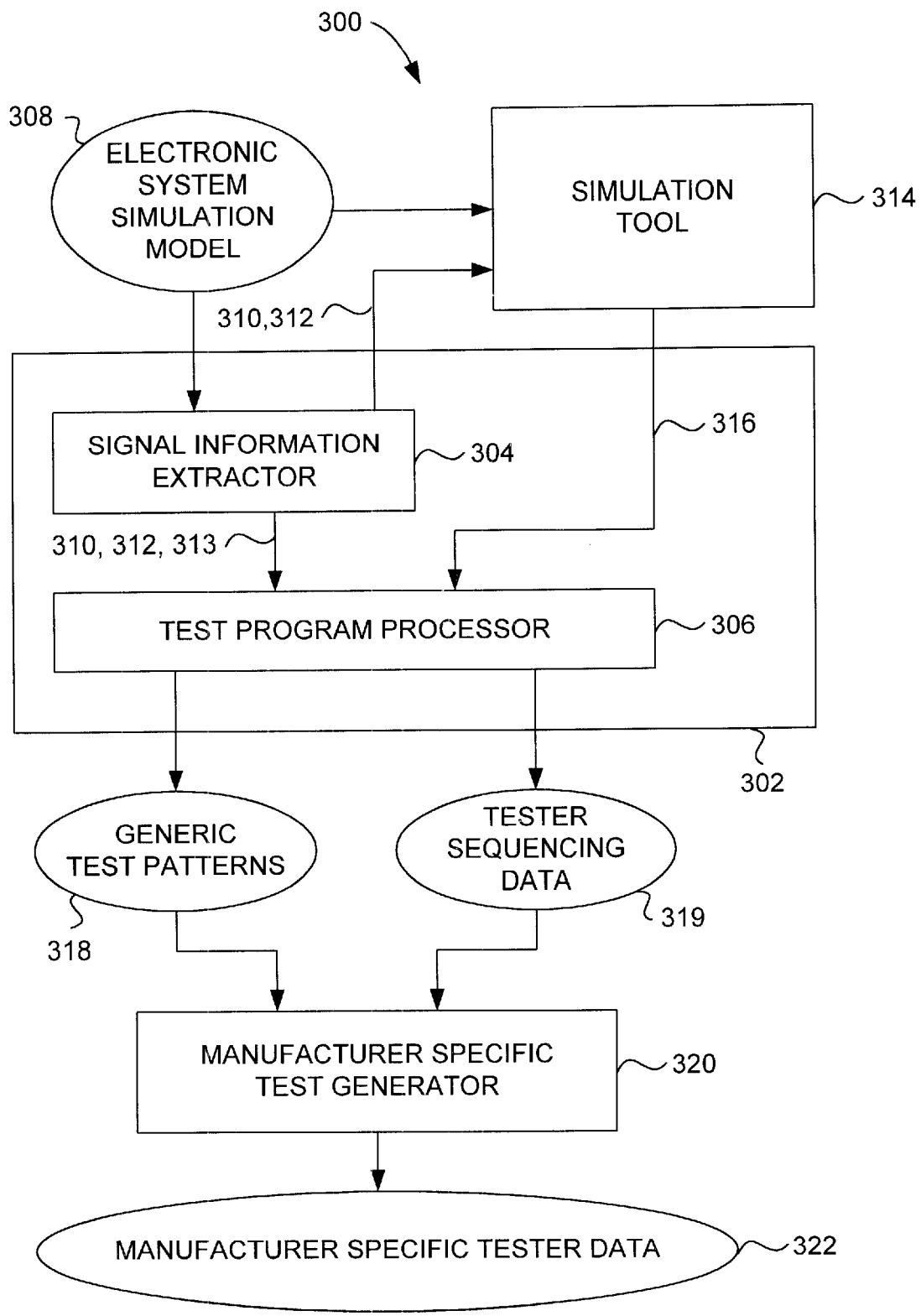
FIG. 3 is a block diagram of an integrated circuit testing system according to the invention.

FIG. 3 is a block diagram of an integrated circuit testing system 300 according to the invention. The integrated circuit testing system 300 includes an automated simulation-to-test data converter 302. The automated simulation-to-test data converter 302 includes a signal information extractor 304 and a test program processor 306. The signal information extractor 304 receives a simulation model 308 for an electronic system. The simulation model 308 is a model built in a modeling and simulation software environment such as that provided by Verilog. Preferably, the model, or at least the portion to be tested with the ATE tester 200, is a gate-level netlist.

The signal information extractor 304 receives as inputs the simulation model 308 and additional information. The additional information includes, for example, the name of the netlist of the integrated circuit (chip) to be tested and a list of the input/output buffer library cells used in the design of the integrated circuit to be tested. The list of the input/output buffer cells includes the names of the pins of each buffer cell along with information as to the active value of the control (enable) pin of the buffer. The additional information may also be provided to the signal information extractor 304 by the simulation model 308.

The signal information extractor 304 processes all the input information and generates two sets of signals to be monitored during the simulation. The first set of signals is a list of I/O pins 312 (I/O pins or I/O pins data) within the simulation model 308 that are at the input/output boundary of the portion of the simulation model 308 to be individually tested. The second set of signals is a list of the control (enable) signals 310 (control signals or control signals data) within the design that control the direction of the bidirectional pins and/or determine the high-impedance state of tristate output pins. In addition to the I/O pins data 312 and the control signals data 310, the signal information extractor 304 deduces control signal mappings 313 between the control signals 310 and the I/O pins 312 they control and the associated active control logic value.

The I/O pins data 312 and the control signals data 310 together with the simulation model is 308 are provided to a simulation tool 314 as illustrated in FIG. 3. This data is provided in such a form that the simulation tool 314 monitors only the logic values of the pins identified by the I/O pins data 312 and the control signals data 310. Thus, the simulation tool 314 is constrained to produce simulation results data 316 specific to a portion of the simulation model 308 (e.g., particular integrated circuit) to be tested by the ATE tester 200. The simulation results data 316 is a record of specific signals that the simulation tool 314 is instructed to monitor and the logic values of the signals during the simulation. The simulation results data 316 is, preferably, in the "print-on-change" format (i.e., where signal logic values are written to the file only when they change). Hence, the simulation tool 314 runs functional tests previously used in simulating the entire simulation model 308 in the design phase, but produces simulation data (i.e., simulation results data) that is relevant for constructing test data for the testing of a specific portion of the simulation model 308.

Using the simulation results data 316, the I/O pins data 312, the control signals data 310 and the control signal mappings 313, the test program processor 306 is able to produce test patterns (test vectors) 318 and tester sequencing data 319. The test patterns 318 and the tester sequencing data 319 are specifically associated with the portion of the simulation model (e.g., particular integrated circuit) to be tested on the ATE tester 200, even though they were obtained from a system (e.g. board-level) simulation. The test patterns 318 are a specification of a set of parallel events performed by drivers and comparators on the ATE tester 200. The events are logical values to be driven in or compared as expected responses in a given tester cycle. The tester sequencing data 319 includes timing information such as the width of the tester cycle (number of frames), association of the drive and compare events on I/O pins to frames in the tester cycle, and the behavior of the drive events on pins (e.g. return-to-zero (RZ), suppressible-return-to-zero (SR0), non-return (NR), etc.).

The test patterns 318 and the tester sequencing data 319 could be directly produced for a specific ATE tester 200. However, since different ATE systems (testers) use different formats and arrangements of test patterns and have different related setup, timing and channel constraints, it is preferred that the test patterns 318 and the tester sequencing data 319 be initially produced in an ATE independent generic format. It is often the case that different portions of the simulation model 308 are manufactured by different vendors who use different ATE systems to test the integrated chips. Translation of ATE data from one particular ATE system to another is a complicated and error-prone process because of different ATE architecture and pattern sequencing capabilities. Efficient porting of test programs between ATE systems, in general, requires a production test engineer who has knowledge of both systems, is alert to the potential difficulties, and who has available a collection of software tools to assist in the conversion. Producing the test patterns 318 and the tester sequencing data 319 in an ATE independent generic format facilitates subsequent conversion to the specific ATE format of a particular manufacturer. Once the information required to make the simulation tests work on a tester has been deduced into the generic format, a straightforward translation can be performed by a manufacturer specific test generator 320 to convert the generic tester data 318, 319 into data specific to the chip manufacturer's ATE system (manufacturer specific tester data 322). Such manufacturer specific test generators 320 (i.e., ATE specific translators) are commercially available and provided by the ATE system manufacturers.

Figure 4:
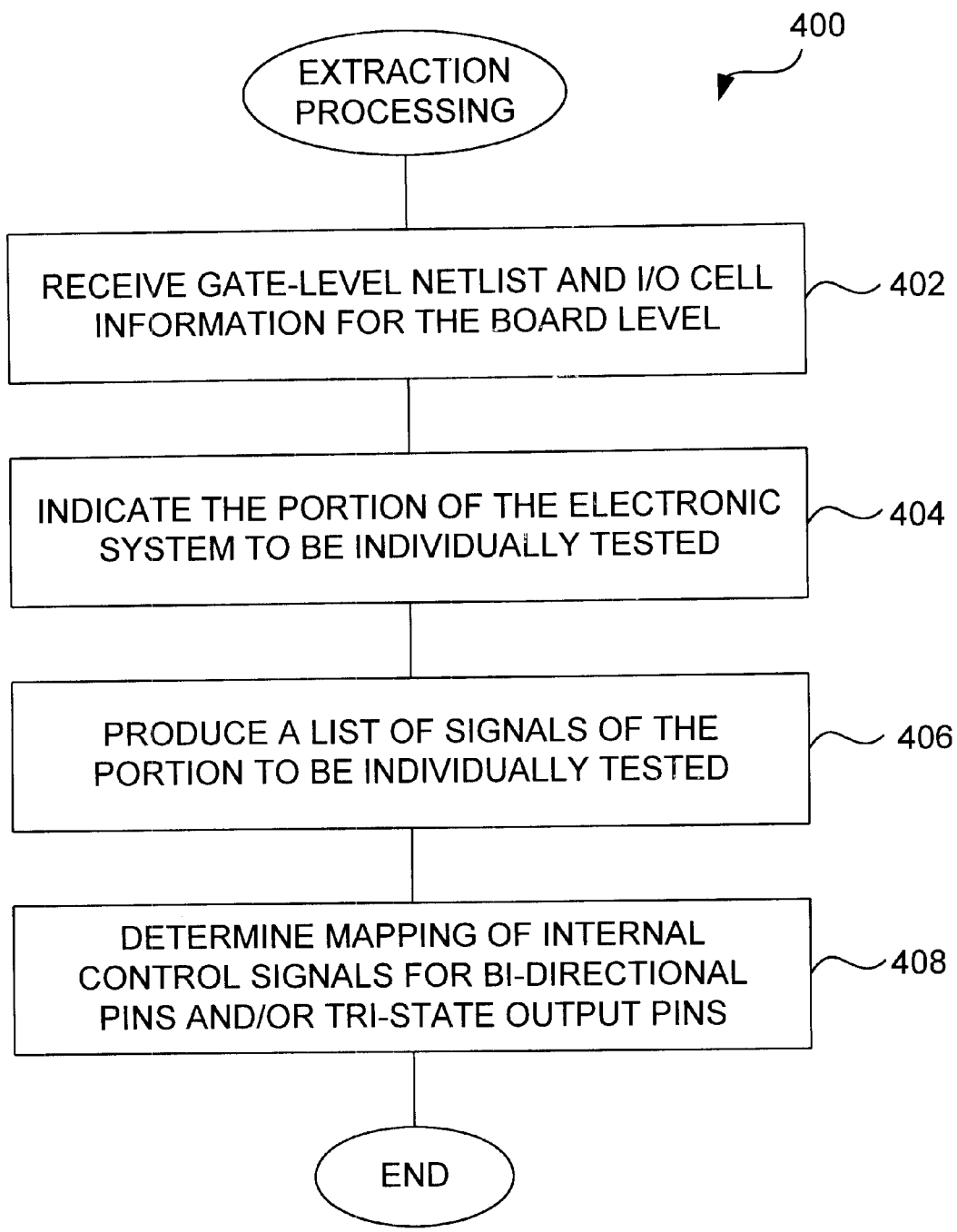
FIG. 4 is a flow chart of extraction processing according to the invention.

FIG. 4 is a flow chart of extraction processing 400 according to the invention. The extraction processing 400 is performed by the signal information extractor 304.

The extraction processing 400 initially receives 402 the data associated with the simulation model 308. Preferably, the data received 402 includes a gate-level netlist and I/O cell information for the electronic system (e.g., circuit board) being modeled. Netlists are well known in the art. As for the I/O cell information, the information is preferably a file containing a list of the I/O buffer cells (i.e., the input/output buffer library cells) used to model bidirectional pins and tristate output pins in the simulation model 308 of the electronic system. Then, the I/O cell information is used to identify the pins within the simulation model which are either bidirectional or output pins which can be tristated, and to determine control signal mapping 313. For example, in the exemplary case, the file containing the I/O buffer cells is provided in Table 1 below, where the syntax for each cell is as follows:

<cell name><enable pin><ACTIVE_HIGH/ACTIVE_LOW><pad or pin>.

TABLE 1

| I/O cell Information |
| --- |
| pt5b03 oen ACTIVE_LOW pad |
| pt5t01 oen ACTIVE_LOW pad |
| pt5b01 oen ACTIVE_LOW pad |
| pc5b02 oen ACTIVE_LOW pad |

In Table 1, the control (enable) pin along with the pad or pin name provides the mapping. The ACTIVE_HIGH/ACTIVE_LOW field indicates the active logic value for asserting the control signal.

Next, the portion of the electronic system to be individually tested is indicated 404. The portion being tested can be any portion of the electronic system being modeled by the simulation model 308. Preferably, the electronic system is a board-level design, and the portion of the electronic system to be individually tested is associated with a particular integrated circuit chip to be tested. Because the electronic system (e.g., board) being modeled is typically a hierarchical design, the portion to be individually tested can be indicated by a path in the model to the pins at the input/output boundary of the portion to be individually tested. For example, the design can be a hierarchical design of modules, and a user can select a module level to simulate by entering a path to that module, e.g., path: "World0.Board0.Control0" would indicate that the controller chip identified by "Control0" would be the portion to be individually tested, which is a part of the simulation model of the board called "Board0, which in turn is a part of a larger simulation model called "World0".

A list (file) of signals of the portion of the electronic system to be individually tested is produced 406. The list of signals produced here contains the I/O pins 312 and the control signals 310, which are produced by the signal information extractor 304 and used by the simulation tool 314 as discussed above with reference to FIG. 3.

An example of a list containing I/O pins 312 and control signals 310 in the case where the simulation tool 314 is Verilog based is provided in Table 2 below. Note that the file contains the Verilog module called "monitor_signals" which can be used in a simulation by the simulation tool 314 in accordance with the functional tests used to simulate the electronic system (e.g. circuit board) model, to record the values of signals that are to be monitored. Most system-level simulation environments monitor activity in various portions of the system. The information and commands that instruct the simulation tool 314 to monitor logic values are typically distributed over different modules of the simulation model. It is essential that all other monitoring in the system simulation model be deactivated and only the I/O pins 312 and the control signals 310 be monitored.

The list of I/O pins 312 and the control signals 310 is also required by the test program processor 306. In addition, the test program processor 306 requires the control signal mappings 313 which are also determined 408 by the signal information extractor 304 in accordance with the test program processing. The control signal mappings 313 are required for the following reason. The output data from the simulation tool 314 consists of logic values of I/O pins and control signals. However, to construct a correct test on the ATE tester 200, the value has to be interpreted as an input value (to be driven in on the tester) or an output value (to be strobed and compared as expected response). For pins which are pure inputs or pure outputs there is no ambiguity. In the case of bidirectional pins and tristate outputs, the logic value of the control signal that controls the pin in conjunction with the knowledge of the logic value that asserts/de-asserts the control signal is used to resolve the ambiguity.

TABLE 2

Simulation Module to Monitor Relevant Signals

```
module monitor_signals;
    initial begin
        $dumpfile ("Control.dump");
        $dumpvars (1,
            Control.ARBusClk,
            Control.Reset_,
            Control.BG_,
            .
            .
            .
            Control.\MONID[ 2],
            Control.\MONID[ 1],
            Control.\MONID[ 0] );
        end
endmodule
```

Preferably, all this information (I/O pins 312, control signals 310 and control signal mappings 313) is stored in one file such as the one shown in Table 3 below. For example, the first listed bidirectional pin named "A0" in Table 3 has a control signal named "AHHoe_" which is asserted with a logic value of '0'. This indicates that the value on the pin "A0" is to be interpreted as an input value to be driven into the chip by the ATE tester 200 if the value of "AHHoe_" at that time is '1'. On the other hand, if the value of "AHHoe_" is '0', the same value on "A0" would have been interpreted as an expected response to be compared on the ATE tester 200.

TABLE 3

List of I/O Pins, Control Signals, and Control Mappings

INPUTS:
ARBusClk
Reset_
BG_
.
.
.
OUTPUTS + ENABLES:
BR_ BREnable_ 0

TABLE 3-continued

List of I/O Pins, Control Signals, and Control Mappings

Figure 5A:
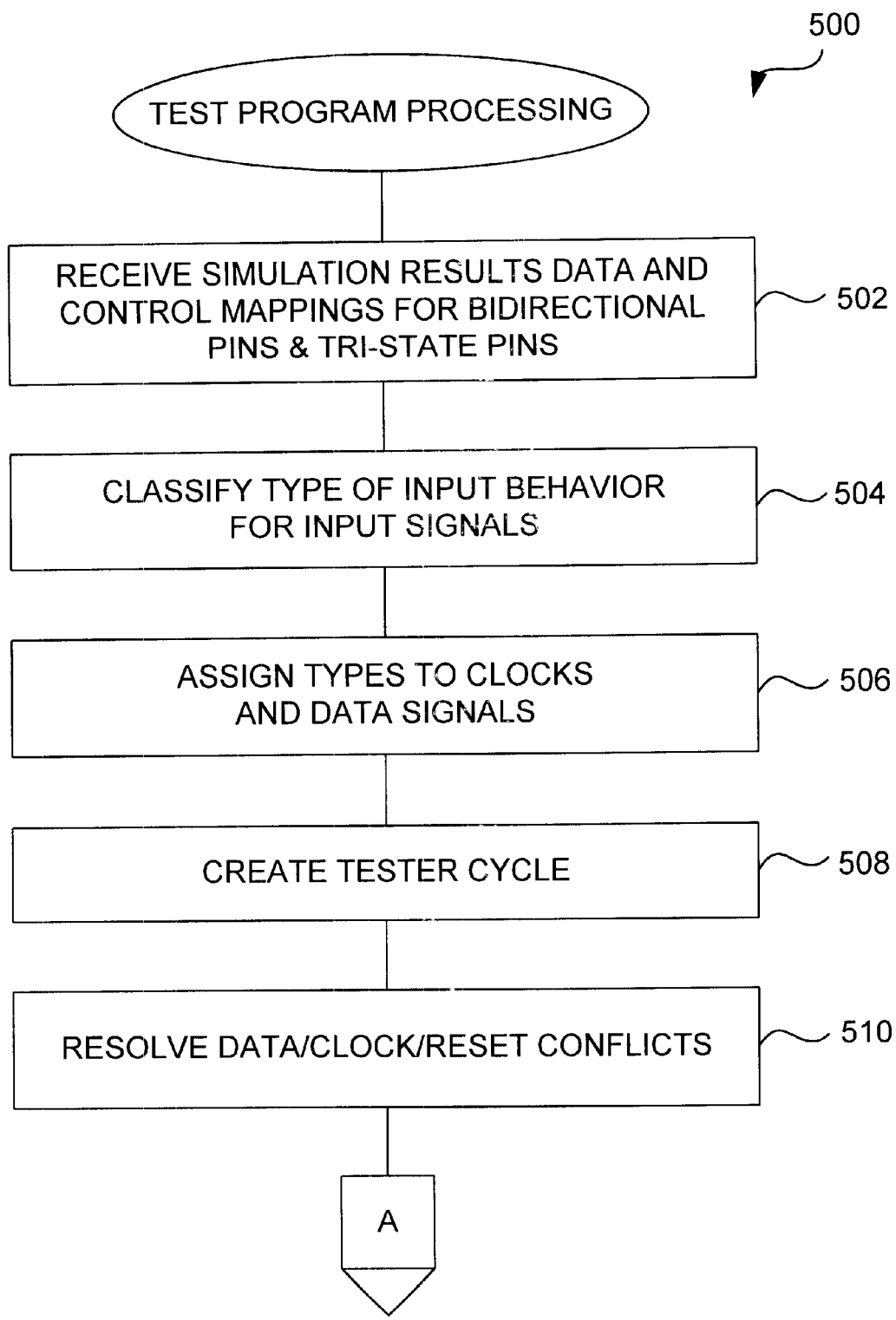
FIGS. 5A and 5B are flow charts illustrating test program processing according to the invention.
Figure 5B:
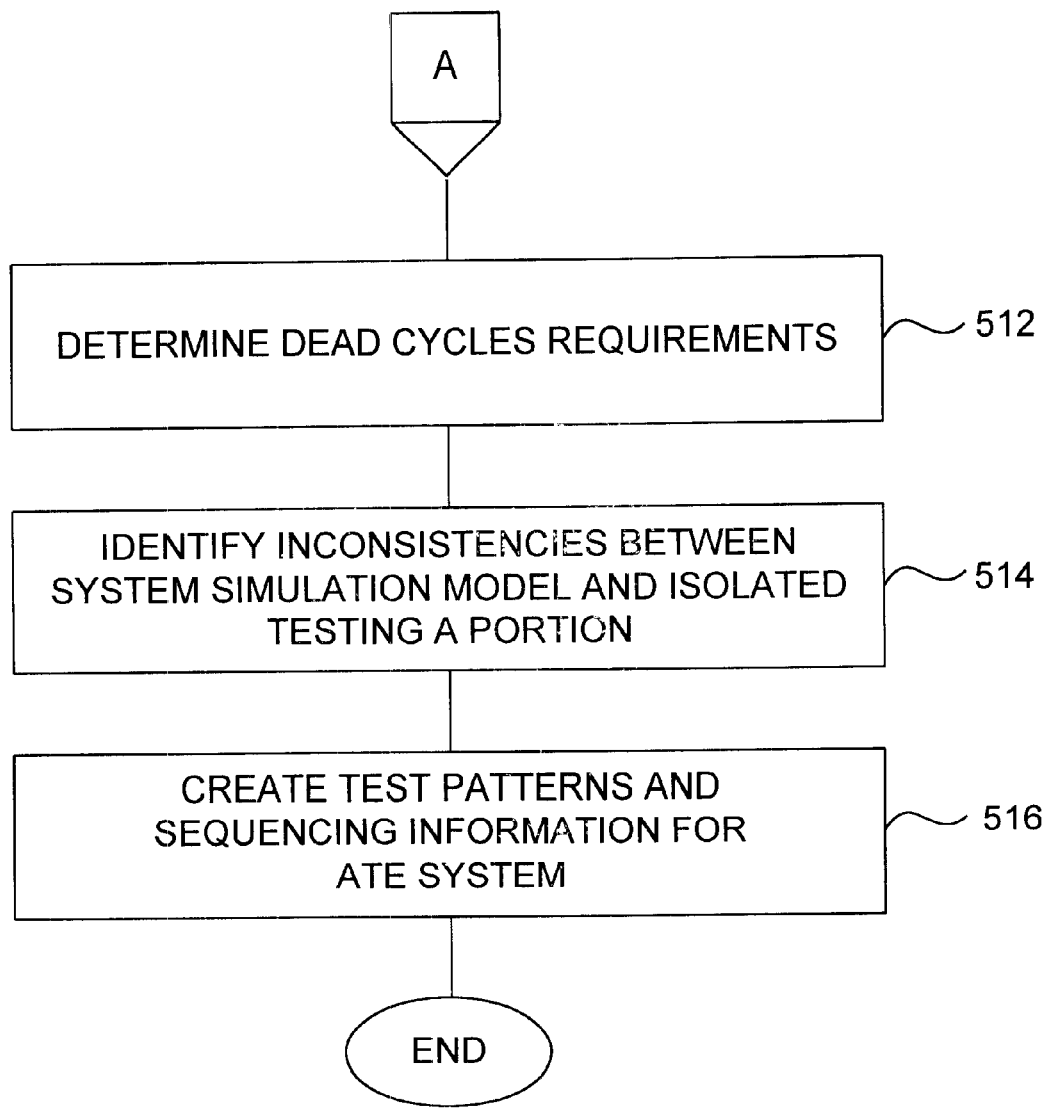

SAck_ SAckEnable_ 0
CI CIEnable_ 0
.
.
.
INOUTS + ENABLES:
A0 AHHoe_ 0
A1 AHHoe_ 0
.
.
.
Sense0 \MONID[ 0] 0
END FIGS. 5A and 5B are flow charts illustrating test program processing 500 according to the invention. The test program processing 500 is performed by the test program processor 306.

The test program processing 500 receives 502 simulation results data 316 from the simulation tool 314 and the I/O pins data 312, the control signals data 310 and the control signal mappings 313 from the signal information extractor 304. Table 4 provides an example of a file which has the simulation results data 316 in a format called "value change dump" (VCD) produced when the simulation tool 314 is Verilog. The VCD file has three relevant sections. The first section (beginning with "$scope" and ending just before "$upscope $end") lists all the I/O pins and the control signals to be monitored during the simulation along unique codes with which they are referred to in the rest of the VCD file. For example, signal ARBusClk has code "!". The second section (beginning with "$dumpvars" and ending with "$end") and the third section (beginning with "#50000") show the logic values on the signals monitored during the simulation. Each line corresponds to a value change event on a signal. The second section lists the logic values on various signals at the start of the simulation (the initial values). For example "x!" implies "x" (or unknown) is the initial logic value on the signal corresponding to the code "!", that is, ARBusCLk. The third section is a time-event list of the simulation. The third section indicates the simulation time (e.g. #50000 which refers to 50000 simulation time units) followed by a list of events that occur at that time during the simulation. This is followed by the next simulation time (#100000) at which an event occurs. The time-event list continues until the end of simulation. Most simulation tools 314 have the capability of stopping the recording of simulation results data 316 for a specified window of time which is reflected as a discontinuity in the time-event list in the VCD file. Note that the simulation-to-test pattern converter 302 does not permit such a discontinuity in the simulation results data 316. The simulation results of the simulation model 308 are used on a physical implementation of the model to test it. If intermediate simulation results were not available, it would be impossible to predict reality on the ATE tester 200.

TABLE 4

Simulation Results Data — VCD file (Verilog)

$date
    Aug 4, 1994      17:26:27
$end
$version

TABLE 4-continued

Simulation Results Data — VCD file (Verilog)

```
VERILOG-XL    1.6a.7.1
$end
$timescale
    10ps
$end
$scope  module  World $end
$scope  module  Board0 $end
$scope  module  Control0 $end
$var  wire  1 !    ARBusClk $end
$var  wire  1 "    Reset_ $end
$var  wire  1 N    BG_ $end
  .
  .
  .
$var  wire  1 s!   \MONID[ 2] $end
$var  wire  1 t!   \MONID[ 1] $end
$var  wire  1 u!   \MONID[ 0] $end
$upscope  $end
$upscope  $end
$upscope  $end
$enddefinitions  $end
$enddefinitions  $end
$dumpvars
x!
1"
x#
  .
  .
  .
xu!
xv!
$end
#50000
0!
#100000
1!
#100878
1O
#110100
  .
  .
  .
```

Next, the test pattern conversion processing 500 classifies 504 the type of the input pin behavior for each input signal. On an ATE tester 200, events on the pins of the integrated circuit under test are constrained to behave in a certain way. For example, an input pin could be allowed to change value once in a tester cycle, either a '0' or a '1', but once it changed it would remain at that value for the duration of the tester cycle. On the other hand, an input pin could be allowed to change value twice in a tester cycle, for example, from '0' to '1' and back to '0'. The ATE tester 200 requires each input pin to be classified according to the way the stimulus on it is intended to behave during a tester cycle. The simulation results data 316 (e.g., the VCD file in Table 4) is scanned to identify the value change pattern on the various signals during the simulation. Depending on the pattern of changes, the type of the signal on the tester is classified 504. Signals which change periodically from '0' to '1' are identified as clocks and the fastest clock is assigned 506 the type SR0 (suppressible-return-to-zero). This means that this pin is at value '0', but during every tester cycle it goes to '1' and returns to '0'. In addition, the type SR0 can be suppressed during some tester cycles. Such pins correspond to the fastest changing signals in the simulation and they determine the window of the events that can occur during a tester cycle. Other clocks (slower than the fastest clocks) as well as the other input signals are determined to be data signals. The data signals are assigned 506 the type NR (non-return) because they change value only once during the tester cycle.

Next, a tester cycle is created 508. A tester cycle corresponds to operations that are performed on the ATE tester 200 in one clock cycle of the ATE system clock. Pins on the integrated circuit (chip) to be tested are assigned to channels on the ATE tester 200. (A group of channels corresponds to a frame in the tester cycle.) Because of physical limitations, these channels are divided into groups and each group of channels is either driven or strobed at the same time during a tester cycle. This physical constraint in turn imposes constraints on the design of the tester cycle. The simulation tool 314, being a software environment, is not limited to the laws of physics. (The ATE tester 200 is limited by the law of physics.) The simulation tool 314 does not impose the same timing constraints as an ATE tester; hence, a straightforward conversion of the simulation results data 316 to test patterns and tester sequencing data can very likely result in a failed test. Thus, the test program processing 500, parses the simulation results data 316, classifies 504 the input and bidirectional pins, and intelligently creates 506 the tester cycle. In creating 506 the tester cycle, the processing 500 also determines the number of frames in the tester cycle and assigns I/O pins to the frames. The creation 506 of the tester cycle and assignment of I/O pins to frames is described in more detail below.

The creation 506 of the tester cycle starts with a default of two frames because that is the minimum required. The signal that has been determined to be the fastest clock (and assigned the SR0 type) as described above is assigned to the two frames. SR0 types go through two transitions in a tester cycle and are assigned to the two frames. If there are multiple SR0 signals and if they transition at the same time they get assigned to the same two frames. However, if there are multiple SR0 type signals which are offset from one another, a distinct frame is required for every transition that is offset. For example, if in the simulation results data 316 there are two SR0 signals A and B with a frequency of 30 MHz and if there is a difference of five (5) nanoseconds between their positive transitions (0-to-1), then four (4) frames are created, corresponding to 0-to-1 transition of A, 0-to-1 transition of B, 1-to-0 transition of A and 1-to-0 transition of B. Similarly (9) nine frames are required if there are three (3) SR0 signals with offsets between each pair.

After creating frames for the clock signals (or the SR0 types), frames for the other signals are created. While scanning the simulation results data 316, note is made of the time at which the logic values of signals change in relation to the changes on the clock signals. Each data signal is tagged with the name of the last clock signal that changes before it and the name of the first clock signal that changes after it and also the type of the clock value transition: 0-to-1 or 1-to-0. All data signals that have the same clock name and clock transition tag are "collapsed" into one group and assigned a new frame. This frame is added in the tester cycle between the frames corresponding to the clock transitions with which the group of data signals are tagged. There are three cases that do not fit into this general creation of frames for data signals: 1) bidirectional pins, 2) reset pins, and 3) data signals that change at exactly the same time as a SR0 type signal. The test program processing 500 is able to handle all three of these cases by resolving 510 them automatically in an intelligent manner.

Case 1) Bidirectional pins: For bidirectional pins, a change in the value of the control signals is observed and tagged with clock names and transitions. This is necessary because a bidirectional pin can have a steady value but can change from an input to an output or vice-versa) which could correspond to a drive or a strobe event. Also, it is possible that a bidirectional pin might need different frames for drive events in the input mode and strobes in the output mode.

Case 2) Reset pins: Reset pins are usually asserted once during the length of a simulation and the timing of the reset is crucial in ensuring that the chip is in the reset state at the correct point in time. In the case of a reset pin, in addition to the tags, information about the total number of clock transitions before the reset is asserted, is noted. The frame for the reset is created to ensure that in the ATE test patterns, the reset occurs after the correct number of clock transitions.

Case 3) Data-clock conflict: In cases where the data signal changes at the same time as a clock signal, the data change is interpreted as if it occurred one frame before the clock transition frame.

This ensures that the test patterns are valid for fault simulation performed even in zero-delay modes.

The input stimulus in the design simulation is designed taking into account various setup and hold requirements and hence results in a finer distribution of input events over a clock cycle. The collapsing of logic values on input pins into frames changes the timing of the stimulus for the integrated circuit (chip) on the ATE tester 200 as compared to the design simulation. However, the test patterns are run on the ATE tester 200 at a much slower speed (e.g., 1 MHz) in comparison to the simulation which is usually designed for operating frequencies (e.g., 30 MHz). Collapsing of input stimuli into frames in a 1 MHz (i.e., 1000 nanoseconds) tester cycle does not present setup and hold concerns.

Next, the test program processing 500 determines 512 where dead cycles need to be inserted into the test pattern set. Dead cycles are tester cycles in which the clocks (SR0 and SR1 type signals) are suppressed and the inputs remain the same as the previous cycle. Dead cycles are required in the case of bidirectional pins for two reasons: 1) to prevent damaging the chip on the tester, and 2) to avoid any loss of fault coverage. If a bidirectional pin changes from an input to an output in the same tester cycle, driving in a value on the ATE tester 200 at the time when it is an output can result in damaging the chip because both the chip and the ATE tester 200 end up driving the pin. In such a situation, a dead cycle is inserted at a point such that the suppression of the clock during the dead cycle delays the change to an output mode to the next tester cycle. Now, in the cycle following the dead cycle, the clock can be pulsed and the bidirectional pin can be strobed as an output. No input value needs to be driven in because that was taken care of in the dead cycle. Also, when a bidirectional pin changes from an input to an output back to an input, two consecutive tester cycles drive in input values and the output value is lost, resulting in a loss of fault coverage. Inserting a dead cycle at such a point ensures good fault coverage of the test pattern set.

Preferably, the dead cycle determination 512 first determines which of the bidirectional pins require dead cycles. This is done while scanning the simulation results data 316 and bidirectional pins whose control signals change twice in the period corresponding to the period of signals (clock signals) determined as SR0/SR1 type. Then, for such bidirectional pins, points in simulation time at which dead cycles are required are noted. Thereafter, during the construction of the test patterns, dead cycles are inserted for the appropriate pins at the appropriate time. Without this feature, the designer would have to design the simulations such that a need for dead cycles does not arise. This constrains the designer in designing the simulation and also affects the quality of the simulation in terms of functional coverage. Automatic handling of dead cycles as provided by the invention frees the designer to design his simulation with the confidence that the converted test patterns will work correctly on the ATE tester 200.

The test program processing 500 also identifies 514 inconsistencies between the simulation model and isolated testing of a portion of the simulation model. Namely, in the case of tristate outputs, the test vectors should also be modified so that the expected response is consistent with what happens when the integrated circuit (chip) is tested in isolation. For example, consider the case in which the control signal of an tristate output pin in the VCD file (simulation results data 316) is in the inactive state. In this case, the simulated value on the output pin is a '0' or a '1' depending on whether the pin is connected to an external pull-down or a pull-up resistor in the board level simulation. However, when the chip corresponding to the portion of the simulation model to be tested is tested in isolation, there no pull-up or pull-down resistances and the output pin is in a high-impedance state. Hence, the expected response for that pin under these conditions should be 'Z' (high-impedance). The test program processor 306 identifies such conditions, interprets the '0' or '1' in the VCD file appropriately as 'Z' and modifies the test patterns accordingly.

Finally, test patterns (test vectors) for the ATE tester 200 are created 516. The test patterns are preferably contained in a file as a list of applied values to the inputs and bidirectional pins acting as inputs, and expected values from the outputs and the bidirectional pins acting as outputs. Table 5 below provides an example of such a file (test patterns file) containing the generic test patterns 318. By design the format of the file shown in Table 5 is similar to the "table" format used in FlexTest, but may be arranged or formatted differently. FlexTest is a software-based Automatic Test Pattern Generation (ATPG) system available from Mentor Graphics Corporation of Oregon.

In Table 5, the format and arrangement of the test patterns file includes two sections. The first section lists the input pins (PI), the output pins (PO), and the bidirectional pins (IO_HL). The second section lists the generic test patterns 318. Each test pattern on a line indicates signal action for each of the input, output and bidirectional pins for a tester cycle. The order of the logic values in the test patterns corresponds to the order in which the pins are list in the first section. For all input pins, the logic values are values to be driven in when the chip is on the tester, while for the output pins the logic values are the expected responses to be compared by the strobing. Also, for the bidirectional pins information as to whether the direction of the pin is an input or output is encoded. A "0" logic value for a bidirectional pin implies that a logic "0" is driven in (input mode), while a "L" value in the test pattern implies that the pin is in the output mode and the expected response is a logic "0". The values of "1" and "H" are similarly interpreted. In addition, "x" means don't care, "z" means high impedance, "P" means positive pulse, and "N" means negative pulse. Note that "P" and "N" can be used only with signal types SR0 and SR1 (clocks), respectively. A logic "0" for a SR0 type pin implies that the clock has be suppressed for that particular tester cycle and results in what is referred to above as a dead cycle. Likewise, a logic "1" for a SR1 pin type implies that the clock has be suppressed for that particular tester cycle and results in a dead cycle.

Note that although not shown in Table 5, a test pattern for a dead cycle would differ from the previous test pattern by not pulsing the clocks designated SR0 (i.e., P's become 0s), changing the control signal line for the bidirectional pin switching from input to output or vice versa in the dead cycle, and maintaining all other signals as they were in the previous test pattern.

TABLE 5

Test Patterns File

PI ARBusClk
PI Reset_
.
.
.
PO BR_
PO SAck_
.
.
.
IO_HL A0
IO_HL A1
P1x1x10xP1xxxxxxxxxxxxxxxxxxxxxxxxxxxxxxxxxxxxxxxxxxxxxxxxxxxxxxxxx
P0111101P11101010001xx10000111111111111111111xxxxxxxxx00001xx10xx1xxxx
P0111101P11101010001xx100001111111111111111111111111111100001xx100x1zxxx
.
.
.

To facilitate the conversion of the generic test patterns 318 to the manufacturer specific tester data 322, preferably three files are produced by the test program processor 306 in a format for the manufacturer specific test generator 320. One of the three files is a script file of commands indicating number of frames for tester cycle, assignments of signal types (e.g., SR0, NR), and other timing information for the signals in a format suitable for the manufacturer specific test generator 320 (Table 6). The second of the three files contains test patterns (e.g., values for pins and information as to type of pin-input, output or bidirectional) for the manufacturer specific pattern generator 320 which in this case is FlexTest. In Tables 6 and 7 below examples of such files are illustrated for use with FlexTest. The third of the three files contains actual time plate information in time units (e.g., nanoseconds). This file is used to annotate each frame with a time which will be used when the chip is tested on the IC tester.

TABLE 6

Script File of Commands
for Tester Sequencing Data set test cycle 5
add pin constraints ARBusClk SR0 1 0 3
add pin constraints VidClk SR0 1 1 3
setup pin constraints NR 1 2
setup pin strobes 3

In Table 6, the first line defines the width of the tester cycle, which is the number of parallel events (i.e., frames) that occur on the tester. In this example, the tester cycle has five (5) frames. The "add pin constraints" and "setup pin constraints" commands define the type of the input pins and their behavior. For example, the second line in Table 6 defines the pin named "ARBusCLk" to be of the SR0 type and the fourth line defines all other pins to be of type NR. The definition of pin type is followed by three pulse parameters—the frequency of the pulse in a tester cycle, the offset in the tester cycle and the width of the pulse.

For example, the pin "ARBusCLk" has a single pulse every tester cycle, the pulse is offset is zero (0) frames and the width of the pulse is three (3) frames. For the NR type signal, the third parameter is not required since a NR type signal changes only once in the tester cycle and there is no notion of width. Also, the frame in which the output pins are strobed is defined by the "setup pin strobes" command. In this example, the output pins are strobed in frame three (3).

One of the most useful capabilities of this invention is that it facilitates accurate fault grading of the test patterns. Fault grading is the process of estimating the quality of the test pattern set in terms of fault coverage which is determined by a process called fault simulation. Commercial fault simulators are available to perform fault grading. Fault coverage is the percentage of faults (i.e., defects that a set of patterns can detect) in a chip. During fault simulation, faults are injected into the simulation model of the chip and the test patterns are simulated to determine how many faults can be detected by the test patterns. A fault simulation on the simulation data is not an accurate estimate of fault coverage. Since the test program processing 500 ensures that the test patterns are correct in the sense that they will work on an actual tester and complete in the sense that they cover all stimuli used in the simulation an accurate measure of fault coverage is achieved.

Preferably, the invention is implemented by a computer system. The computer system executes computer readable code to carry out the operations of the automated simulation-to-test data converter 302 discussed above, particularly those operations shown and described with reference to FIGS. 4, 5A and 5B.

Figure 6:
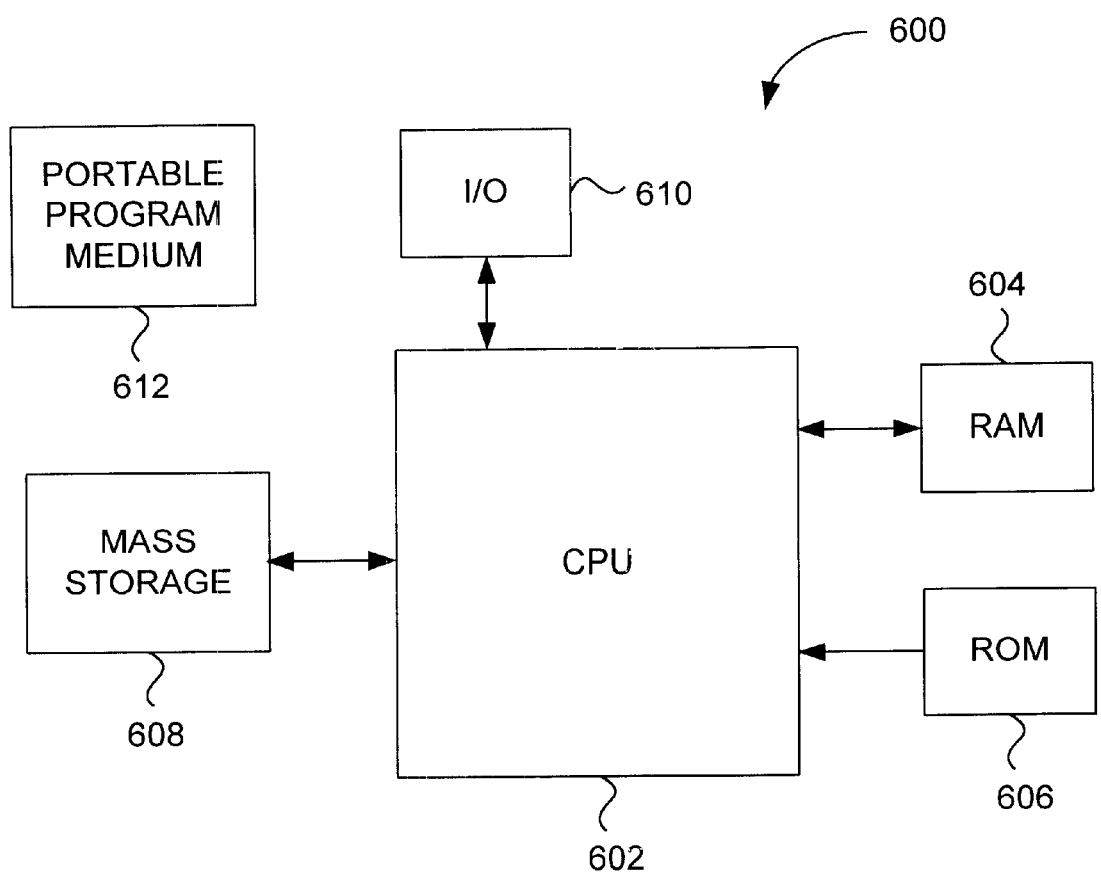
FIG. 6 is a schematic diagram of a representative computer system on which operations associated with the invention can be performed.

FIG. 6 is schematic diagram of a representative computer system 600 on which operations (e.g., extraction processing, test pattern conversion processing) associated with the invention can be performed. The computer system 600 includes a central processing unit (CPU) 602 which is coupled bidirectionally with random access memory (RAM) 604 and unidirectionally with read only memory (ROM) 606. The mass 30 storage device 608, such as a hard disk, CD-ROM drive, magneto-optical drive, tape drive or the like, is coupled bidirectionally with CPU 602. The mass storage device 608 generally includes additional programming instructions and data that typically are not in active use by the CPU 602. The computer system 600 further includes an input/output source 610 that typically includes input media such as a keyboard, pointer devices (e.g., a mouse or stylus) and/or network connections. Additional mass storage devices (not shown) may also be connected to CPU 602 through a network connection. The CPU 602 together with an operating system (not shown) operate to execute computer code. The computer code may reside on the RAM 604, the ROM 606, or a mass storage device 608. The computer code could also reside on a portable (or removable) storage medium 612 and then loaded or installed onto the computer 600 when needed. Portable storage mediums 612 are computer readable and include, for example, CD-ROMS, PCM-CIA devices, RAM devices, floppy disk, magnetic tape, and the like. It will be appreciated by those skilled in the art that the above described hardware and software elements, as well as networking devices, are of standard design and construction and are familiar to those skilled in the art.

The many features and advantages of the present invention are apparent from the written description, and thus, it is intended by the appended claims to cover all such features and advantages of the invention. Further, since numerous modifications and changes will readily occur to those skilled in the art, it is not desired to limit the invention to the exact construction and operation as illustrated and described. Hence, all suitable modifications and equivalents may be resorted to as falling within the scope of the invention.

What is claimed is:

1. A computer-implemented method for functionally testing an integrated circuit chip using test patterns derived from simulation tests performed on a system model which includes the integrated circuit chip, said method comprising:
   (a) receiving a simulation model for an electronic system and a simulation test for the simulation model;
   (b) identifying a portion of the simulation model to be individually tested;
   (c) producing portion-specific simulation test data based on at least the portion identified in (b) and the simulation test; and
   (d) deriving test patterns for testing the portion identified in (b) using the portion-specific simulation test data.

2. A computer-implemented method as recited in claim 1, wherein the portion identified in (b) is an integrated circuit chip.

3. A computer-implemented method as recited in claim 2, wherein the derived test patterns are IC tester data patterns used on an automatic testing equipment (ATE) type chip tester.

4. A computer-implemented method as recited in claim 1, wherein the portion-specific simulation test data comprises a time event list including signal values and relative times for signal changes.

5. A computer-implemented method as recited in claim 1, wherein said method further comprises:
   (e) fault grading the derived test patterns.

6. A computer-implemented method as recited in claim 1, wherein said method further comprises:
   (e) determining, using the simulation model, internal control signals for bidirectional pins and/or tristate output pins within the portion of the simulation model.

7. A computer-implemented method as recited in claim 1, wherein said method further comprises:
   (e) determining, using the simulation model, internal control signals for bidirectional pins and/or tristate output pins within the portion of the simulation model, and
   wherein said deriving (d) comprises including one or more dead cycles within the derived test patterns so that certain of the bidirectional pins can be properly tested without loss of fault coverage.

8. An automated method for producing test patterns for testing an integrated circuit (IC) chip on an IC tester by deriving the test patterns from a system model and a simulation test for the system model, said method comprising:
   (a) receiving the system model;
   (b) determining the signals within the system model that correspond to pins of the IC chip;
   (c) determining internal control signals for the pins of the IC chip that are bidirectional or tristate outputs;
   (d) using a simulation tool, the system model and the signals determined in (b) and (c), produce a time event list for the IC chip, the time event list including at least relative times for signal changes;
   (e) scanning the time event list to determine a tester cycle for the IC tester and a number of frames for the tester cycle; and
   (f) deriving test patterns for testing the IC chip on the IC tester in accordance with the time event list.

9. An automated method as recited in claim 8, wherein said scanning (e) comprises:
   (e1) scanning the time event list for the IC chip to determine which of the signals are clocks;
   (e2) setting the tester cycle based on the fastest one or more of the clocks; and
   (e3) scanning the time event list to determine the number of frames needed for the tester cycle so as to support changes to all the signals determined in (b) and (c), as such changes must occur at a frame.

10. An automated method as recited in claim 8, wherein said deriving (f) comprises:
    (f1) forming the test patterns for the IC tester in accordance with the time event list; and
    (f2) inserting dead cycles into the test patterns as necessary for the IC tester to support the pins of the IC chip that are bidirectional which change direction and are driven and strobed in a single tester cycle.

11. An automated method as recited in claim 8, wherein the inconsistencies between system-level simulation and isolated testing of a portion of the system are resolved in the derived test patterns.

12. An automated method as recited in claim 8, wherein the time event list is adjusted prior to said deriving (f) to compensate for isolated testing of the IC chip.

13. An automated method as recited in claim 8, wherein said method further comprises (g) testing the functionality of the IC chip in the IC tester in accordance with the derived test patterns.

14. An automated method as recited in claim 8, wherein said method further comprises:
    (g) fault grading the derived test patterns.

15. An automated method as recited in claim 8, wherein the derived test patterns are IC tester data patterns and the IC tester is an automatic testing equipment (ATE) type chip tester.

16. A computer-implemented method for functionally testing an integrated circuit chip using test patterns derived from simulation tests performed on a system model which includes the integrated circuit chip, said method comprising:
    (a) receiving simulation test information for testing the system model;
    (b) extracting signals pertaining to the integrated circuit chip from the simulation test information; and
    (c) deriving test patterns for testing the integrated circuit chip based on the extracted signals.

17. A computer-implemented method as recited in claim 16, wherein said method further comprises (d) testing the functionality of the integrated circuit chip on an IC tester using the derived test patterns.

18. A computer-implemented method as recited in claim 16, wherein the system model is a hardware description language model.

19. A computer-implemented method as recited in claim 16, wherein the simulation test information comprises a time event list including at least relative times for signal changes.

20. A computer-implemented method as recited in claim 16, wherein said method further comprises:
(d) determining, using the simulation test information, internal control signals for bidirectional pins and/or tristate output pins within the portion of the electronic system, and
wherein said deriving (c) comprises including one or more dead cycles within the derived test patterns so that certain of the bidirectional pins can be properly simulation.

21. An apparatus for functionally testing an integrated circuit chip using test patterns derived from simulation tests performed on a system model which includes the integrated circuit chip, said apparatus comprises:

means for receiving a simulation model for an electronic system and a simulation test for the simulation model;

means for identifying a portion of the simulation model to be individually tested;

means for producing portion-specific simulation test data based on at least the identified portion of the simulation model and the simulation test; and means for deriving test patterns for testing the identified portion of the simulation model using the portion-specific simulation test data.

22. An automated simulation-to-test pattern conversion system for use in testing an integrated circuit chip, comprising:

a signal extractor for receiving data associated with an electronic system simulation model, and for identifying signals within the electronic system simulation model that are relevant to testing the integrated circuit chip and for identifying control signals for bidirectional pins or tristate output pins within the electronic system simulation model;

a test information producing unit, operatively connected to said signal extractor, for producing a chip-specific test information for the integrated circuit chip to be tested in accordance with the electronic system simulation model, the identified signals, and a simulation test for the electronic system simulation model; and a test pattern processor, operatively connected to said test information producing unit, for receiving the chip-specific test information and the identified control signals and for producing test patterns for testing the integrated circuit chip functionally as it was tested on a system level.

23. A system as recited in claim 22, wherein the test patterns produced by said test pattern processor are for an IC tester.

24. A system as recited in claim 23, wherein said test pattern processor (i) determines a tester cycle for the IC tester, (ii) determines from the chip-specific test information and the identified control signals, the bidirectional pins of the integrated circuit chip that require dead tester cycles and provides (iii) a dead cycle within the test patterns for the bidirectional pins of the integrated circuit chip that are determined to change direction in the same tester cycle of the chip-specific test information.

25. A system as recited in claim 23, wherein the IC tester is an ATE tester, and
wherein said system further comprises:
a manufacturer specific pattern generator for converting the test patterns produced by said test pattern processor to test patterns that are modified for a particular manufacturer's ATE tester.

26. A system as recited in claim 25, wherein said manufacturer specific pattern generator also verifies the quality of the test patterns.

27. A system as recited in claim 22, wherein the integrated circuit chip is able to be tested using the simulation test for the electronic system simulation model, thereby functionally testing the integrated circuit chip in the manner for which it will be used.

28. A system as recited in claim 22, wherein the integrated circuit chip to be tested is a ASIC chip.

29. A computer readable medium containing program instructions for functionally testing an integrated circuit chip using test patterns derived from simulation tests performed on a system model which includes the integrated circuit chip, said computer readable medium comprising:

computer readable code devices for receiving a simulation model for an electronic system and a simulation test for the simulation model;

computer readable code devices for identifying a portion of the simulation model to be individually tested;

computer readable code devices for producing portion-specific simulation test data based on at least the portion identified and the simulation test; and computer readable code devices for deriving test patterns for testing the portion identified using the portion-specific simulation test data.

* * * * *